(12) United States Patent
Xu et al.

(10) Patent No.: US 10,262,890 B1
(45) Date of Patent: Apr. 16, 2019

(54) METHOD OF FORMING SILICON HARDMASK

(71) Applicant: International Business Machines Corporation, Armonk, NY (US)

(72) Inventors: Peng Xu, Santa Clara, CA (US); Kangguo Cheng, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/916,543

(22) Filed: Mar. 9, 2018

(51) Int. Cl.
| | |
|---|---|
| *H01L 21/762* | (2006.01) |
| *H01L 21/8232* | (2006.01) |
| *H01L 29/78* | (2006.01) |
| *H01L 29/66* | (2006.01) |
| *H01L 29/06* | (2006.01) |
| *H01L 21/308* | (2006.01) |
| *H01L 21/3105* | (2006.01) |
| *H01L 21/28* | (2006.01) |
| *H01L 29/161* | (2006.01) |
| *H01L 29/51* | (2006.01) |
| *H01L 27/088* | (2006.01) |
| *H01L 21/306* | (2006.01) |
| *H01L 21/311* | (2006.01) |
| *H01L 29/423* | (2006.01) |

(52) U.S. Cl.
CPC .... *H01L 21/76224* (2013.01); *H01L 21/2807* (2013.01); *H01L 21/28194* (2013.01); *H01L 21/308* (2013.01); *H01L 21/30604* (2013.01); *H01L 21/31055* (2013.01); *H01L 21/31116* (2013.01); *H01L 21/8232* (2013.01); *H01L 27/0886* (2013.01); *H01L 29/0649* (2013.01); *H01L 29/161* (2013.01); *H01L 29/517* (2013.01); *H01L 29/66795* (2013.01); *H01L 29/785* (2013.01); *H01L 29/42364* (2013.01)

(58) Field of Classification Search
CPC ......... H01L 21/76224; H01L 21/31055; H01L 27/0886; H01L 29/517; H01L 29/161; H01L 21/2807; H01L 21/28194; H01L 21/31116; H01L 21/308; H01L 29/0649; H01L 29/66795; H01L 29/785; H01L 21/8232; H01L 21/30604; H01L 29/42364
See application file for complete search history.

(56) References Cited

U.S. PATENT DOCUMENTS

| | | |
|---|---|---|
| 7,138,323 B2 | 11/2006 | Kavalieros et al. |
| 7,678,658 B2 | 3/2010 | Yang et al. |
| 7,947,589 B2 | 5/2011 | Muralidhar et al. |
| 8,043,920 B2 | 10/2011 | Chan et al. |

(Continued)

*Primary Examiner* — Karen Kusumakar
(74) *Attorney, Agent, or Firm* — Vazken Alexanian; Ryan, Mason & Lewis, LLP

(57) ABSTRACT

A method for manufacturing a semiconductor device includes patterning a plurality of fins on a semiconductor substrate, wherein a hardmask is formed on each of the plurality of fins, forming a dielectric layer on the semiconductor substrate between the plurality of fins, removing the hardmasks from each of the plurality of fins, forming a plurality of cap layers in place of the removed hardmasks on each of the plurality of fins, wherein the plurality of cap layers comprise at least one of amorphous silicon and polycrystalline silicon, and selectively recessing the dielectric layer with respect to the plurality of cap layers.

20 Claims, 5 Drawing Sheets

(56) References Cited

U.S. PATENT DOCUMENTS

| | | |
|---|---|---|
| 8,815,670 B2 | 8/2014 | Basker et al. |
| 9,209,185 B2 | 12/2015 | Ching et al. |
| 9,281,378 B2 | 3/2016 | Ching et al. |
| 9,397,099 B1 | 7/2016 | Huang |
| 9,754,798 B1 | 9/2017 | Bi et al. |
| 2007/0249174 A1* | 10/2007 | Yang .................. H01L 21/0334 438/712 |
| 2011/0298041 A1 | 12/2011 | Renn |
| 2015/0318215 A1* | 11/2015 | Taylor, Jr. ......... H01L 21/30604 257/506 |

\* cited by examiner

METHOD OF FORMING SILICON HARDMASK

TECHNICAL FIELD

The field generally relates to semiconductor devices and methods of manufacturing same and, in particular, to forming a hardmask with increased etch selectivity with respect to a material of an isolation region.

BACKGROUND

In conventional processing of semiconductor devices, such as fin field-effect transistor (FinFET) devices, due to finite etch selectivity between hardmask and isolation region dielectric materials, it can be difficult to recess isolation regions (e.g., shallow trench isolation (STI) regions) selective to hardmasks, especially when the recessing is performed in relatively small trenches. For example, etching of an oxide isolation region with respect to a nitride hardmask on a semiconductor fin may result in erosion of the hardmask and subsequent damage to the fin. It is important to protect fins during fin reveal processing (recessing of isolation regions) to avoid fin height variations, especially in connection with structures having dual channel (e.g., n-type and p-type) fins being simultaneously processed on the same substrate.

Heavy polymer gases have been used to increase etch selectivity of nitride films during oxide etching. However, the polymers used can block the isolation region from being recessed, especially in smaller trenches.

Accordingly, there is a need for improved methods to address the limitations in etch selectivity between hardmask and isolation region materials.

SUMMARY

According to an exemplary embodiment of the present invention, a method for manufacturing a semiconductor device includes patterning a plurality of fins on a semiconductor substrate, wherein a hardmask is formed on each of the plurality of fins, forming a dielectric layer on the semiconductor substrate between the plurality of fins, removing the hardmasks from each of the plurality of fins, forming a plurality of cap layers in place of the removed hardmasks on each of the plurality of fins, wherein the plurality of cap layers comprise at least one of amorphous silicon and polycrystalline silicon, and selectively recessing the dielectric layer with respect to the plurality of cap layers.

According to an exemplary embodiment of the present invention, a method for manufacturing a semiconductor device includes forming a plurality of channel regions spaced apart from each other and extending vertically from a semiconductor substrate, wherein a hardmask is formed on each of the plurality of channel regions, forming a dielectric layer on the semiconductor substrate between the plurality of channel regions, removing the hardmasks from each of the plurality of channel regions, forming a plurality of cap layers in place of the removed hardmasks on each of the plurality of channel regions, wherein the plurality of cap layers comprise at least one of amorphous silicon and polycrystalline silicon, and selectively recessing the dielectric layer with respect to the plurality of cap layers.

According to an exemplary embodiment of the present invention, a method for manufacturing a semiconductor device includes patterning a semiconductor substrate into a plurality of fins on the semiconductor substrate, wherein a hardmask portion and a dielectric layer are formed in a stacked configuration on each fin of the plurality of fins, forming an isolation layer on the semiconductor substrate between the plurality of fins, removing the hardmask portions from each of the plurality of fins, wherein the removing of the hardmasks from each of the plurality of fins exposes a top surface of each of the dielectric layers, forming a plurality of cap layers in place of the removed hardmasks on each of the exposed top surfaces of each of the dielectric layers, wherein the plurality of cap layers comprise at least one of amorphous silicon and polycrystalline silicon, and selectively recessing the isolation layer with respect to the plurality of cap layers.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 1:
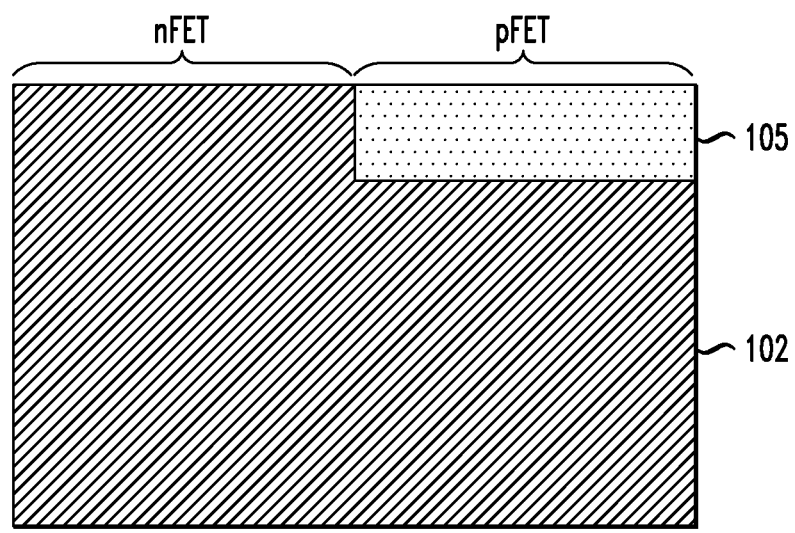
FIG. 1 is a cross-sectional view illustrating formation of pFET region in a semiconductor substrate in a method of manufacturing a semiconductor device, according to an exemplary embodiment of the present invention.

Exemplary embodiments of the invention will now be discussed in further detail with regard to semiconductor devices and methods of manufacturing same and, in particular, to methods for forming and using amorphous silicon or polycrystalline silicon hardmasks (also referred to herein as cap layers) to cover fins when recessing a dielectric isolation layer. It is to be understood that the various layers and/or regions shown in the accompanying drawings are not drawn to scale, and that one or more layers and/or regions of a type commonly used in, for example, a complementary metal-oxide semiconductor (CMOS), field-effect transistor (FET), nanowire FET, fin field-effect transistor (FinFET), metal-oxide-semiconductor field-effect transistor (MOSFET), vertical FET, single electron transistor (SET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, FETs, FinFETs, nanowire FETs, nanosheet FETs, vertical FETs, SETs, CMOSs and/or MOSFETs. By way of non-limiting example, the semiconductor devices can include, but are not necessarily limited to FET, FinFET, nanowire FET, nanosheet FET, vertical FET, SET, CMOS and MOSFET devices, and/or semiconductor devices that use FET, FinFET, nanowire FET, nanosheet FET, vertical FET, SET CMOS and/or MOSFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

FinFET devices include a transistor architecture that uses raised source-to-drain channel regions, referred to as fins. A FinFET device can be built on a semiconductor substrate, where a semiconductor material, such as Si and/or SiGe, is patterned into fin-like shapes and functions as the channels of the transistors. Some FinFET devices include fins with source/drain regions on lateral sides of the fins, so that current flows in a horizontal direction (e.g., parallel to a substrate) between source/drain regions at opposite ends of the fins in the horizontal direction. Other FinFET devices include fins with source/drain regions on top and bottom sides of the fins, so that current flows in a vertical direction (e.g., perpendicular to a substrate) between source/drain regions at opposite ends of the fins in the vertical direction.

FIG. 1 is a cross-sectional view illustrating formation of a pFET region in a semiconductor substrate in a method of manufacturing a semiconductor device, according to an exemplary embodiment of the present invention. Referring to FIG. 1, a semiconductor layer 105 is formed in a pFET region of a semiconductor substrate 102. In accordance with an embodiment of the present invention, the substrate 102 comprises, a semiconductor material including, but not necessarily limited to, silicon (Si), silicon carbide (SiC), Si:C (carbon doped silicon), II-V, III-V compound semiconductor materials or other like semiconductor materials. In addition, multiple layers of the semiconductor materials can be used as the semiconductor material of the substrate. In accordance with an embodiment of the present invention, the semiconductor layer 105 comprises a semiconductor material including, but not necessarily limited to, silicon germanium (SiGe). Another possible material for the semiconductor layer 105 may include germanium.

The semiconductor layer 105 is formed in a pFET region of a resulting device by depositing a hardmask to cover an nFET region, performing patterning (e.g., etching) to recess the substrate 102 in the pFET region, and epitaxially growing the semiconductor layer 105 in the recessed portion, and then stripping the hardmask to result in the structure shown in FIG. 1. In accordance with an embodiment of the present invention, a resulting vertical height (e.g., thickness) of the semiconductor layer 105 after epitaxial growth is about 30 nm to about 60 nm.

Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from 550° C. to 900° C. Although higher temperature typically results in faster deposition, the faster deposition may result in crystal defects and film cracking.

A number of different sources may be used for the epitaxial growth of the compressively strained layer. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, ldisilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Figure 2:
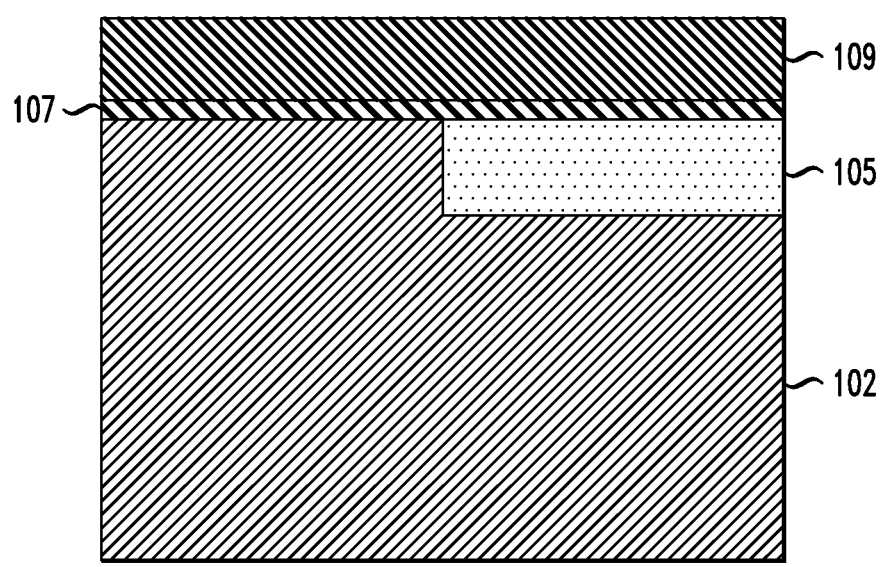
FIG. 2 is a cross-sectional view illustrating formation of a pad oxide layer and a nitride hardmask layer in a method of manufacturing a semiconductor device, according to an exemplary embodiment of the present invention.

FIG. 2 is a cross-sectional view illustrating formation of a pad oxide layer and a nitride hardmask layer in a method of manufacturing a semiconductor device, according to an exemplary embodiment of the present invention. Referring to FIG. 2, an oxide layer 107 having a vertical height (e.g., thickness) of about 2 nm to about 5 nm is formed on the substrate 102 and semiconductor layer 105 using a deposition technique including, but not necessarily limited to, thermal oxidation, chemical oxidation, plasma oxidation, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), and/or sputtering. The oxide layer 107 (also referred to herein as pad oxide) can include, for example, silicon oxide ($SiO_x$), aluminum oxide ($AlO_x$), and/or hafnium oxide ($HfO_x$).

A nitride layer 109 having a vertical height (e.g., thickness) of about 30 nm to about 100 nm is deposited on the oxide layer 107 using a deposition technique including, but not necessarily limited to, CVD, PECVD, RFCVD, PVD, ALD, MLD, MBD, PLD, LSMCD, and/or sputtering. The nitride layer 109 (also referred to herein as pad nitride) can include, for example, silicon nitride (SiN), silicon-boron-carbon-nitride (SiBCN), silicon-oxygen-carbon-nitride (SiOCN), and/or silicon-carbon-nitride (SiCN).

Figure 3:
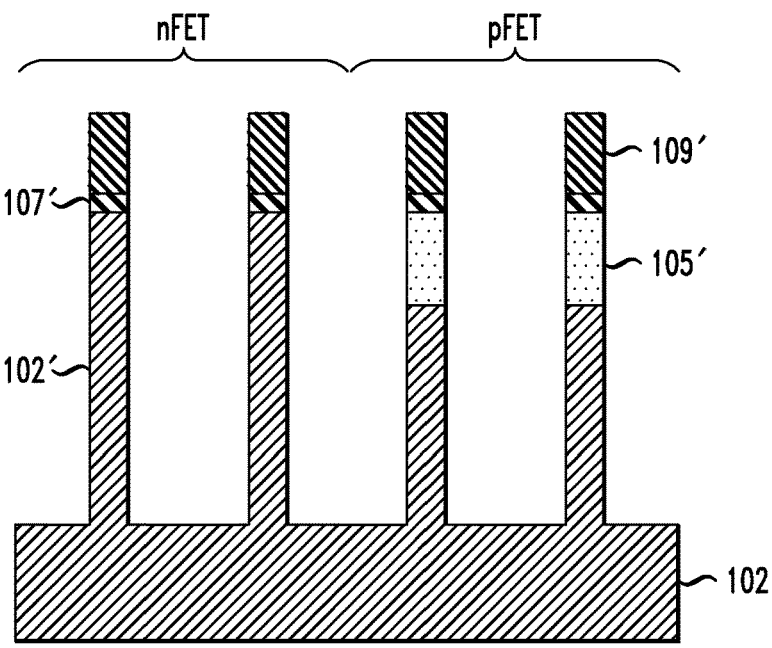
FIG. 3 is a cross-sectional view illustrating patterning to form nFET and pFET region fins in a method of manufacturing a semiconductor device, according to an exemplary embodiment of the present invention.

FIG. 3 is a cross-sectional view illustrating patterning to form nFET and pFET region fins in a method of manufacturing a semiconductor device, according to an exemplary embodiment of the present invention. Referring to FIG. 3, fins, such as fins 102' and 105', can be formed by patterning part of the substrate 102 into fins 102' and part of the substrate 102 and semiconductor layer 105 into the fins 105'. According to an embodiment, the nitride layer 109 is patterned into a hardmask pattern including hardmask portions 109' on portions of the semiconductor layer 105 and substrate 102 that are to be formed into the fins 102' and 105'. The hardmasks 109' can be used to pattern the fins 102' and 105' by reactive ion etch (RIE) processes. While embodiments of the present invention describe channel regions as fins, the embodiments are not necessarily limited to fin channel regions, and may include nanowire channel regions. In addition, although two nFET region fins 102' and two pFET region fins 105' are shown in the figures for ease of explanation, more or less fins can be formed. As can be seen in FIG. 3, portions of the substrate 102 are also removed during fin formation to form recessed portions of the substrate 102 where isolation regions are to be formed.

Figure 4:
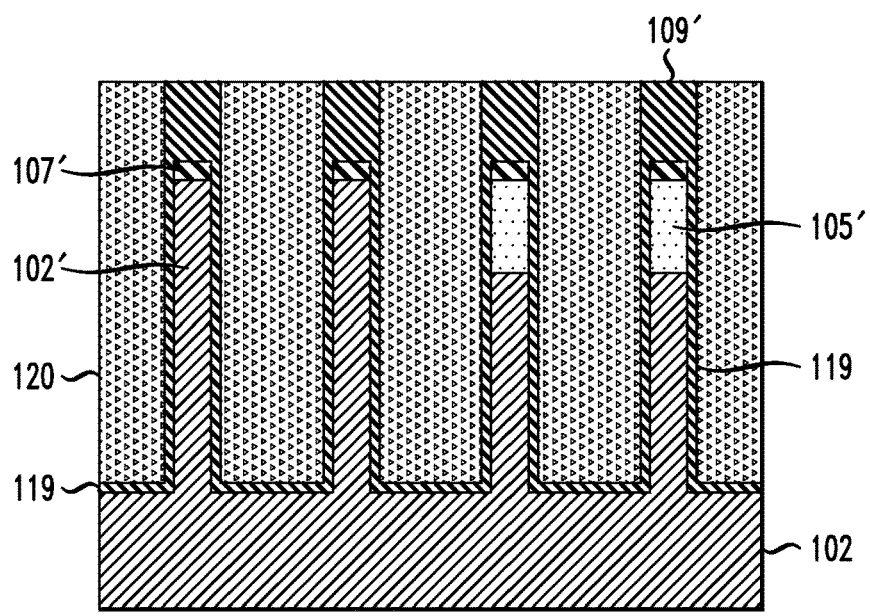
FIG. 4 is a cross-sectional view illustrating deposition of a liner layer and a dielectric material on exposed portions of the substrate and fins in a method of manufacturing a semiconductor device, according to an exemplary embodiment of the present invention.

FIG. 4 is a cross-sectional view illustrating deposition of a liner layer and a dielectric material on exposed portions of the substrate and fins in a method of manufacturing a semiconductor device, according to an exemplary embodiment of the present invention. Referring to FIG. 4, a liner layer 119 including, for example, a nitride, such as, but not necessarily limited to, SiN, boron nitride (BN), silicon boron nitride (SiBN), silicon carbon nitride (SiCN), silicon oxynitride (SiON) and/or silicon-oxygen-carbon-nitride (SiOCN), is conformally deposited using a conformal deposition technique, such as, for example, ALD, on exposed portions of the top surface of the substrate 102, on sidewalls of the fins 102' and 105' including the patterned oxide layers 107' and hardmask portions 109', as well as on top of the hardmask portions 109'.

A dielectric material layer 120, including, but not necessarily limited to, an oxide, such as, silicon oxide ($SiO_x$), borosilicate glass (BSG), phosphosilicate glass (PSG), borophosphosilicate glass (BPSG), and/or fluorine-doped silicon oxide (SiOF), is formed on the substrate 102 and around the fins 105' including the liner layer 119. The dielectric material layer 120 can be deposited using a deposition technique including, but not necessarily limited to, CVD, PECVD, RFCVD, PVD, ALD, MLD, MBD, PLD, LSMCD, spin-on coating, and/or sputtering, followed by a planarization process down to the hardmasks 109', such as, chemical mechanical planarization (CMP) to remove excess dielectric and liner material.

Figure 5:
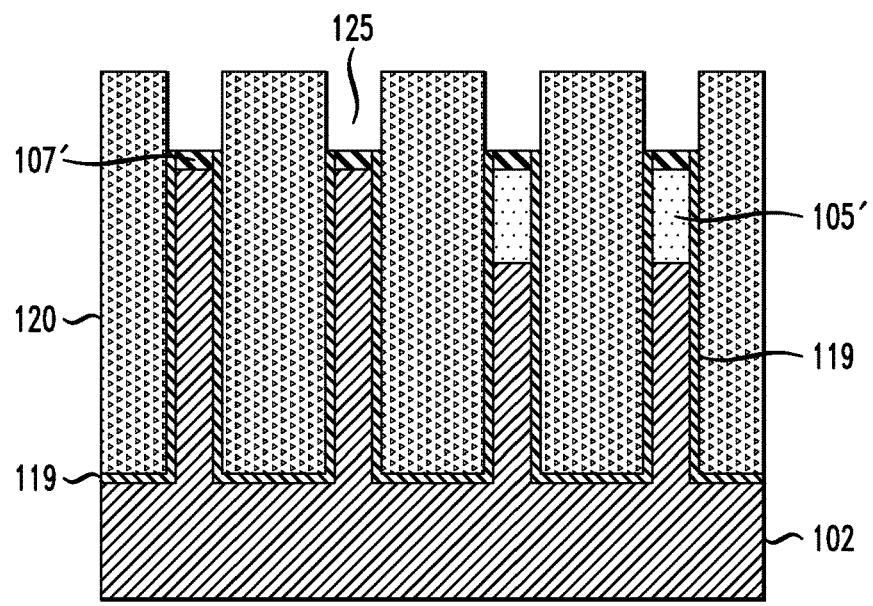
FIG. 5 is a cross-sectional view illustrating hardmask removal, according to an exemplary embodiment of the present invention.

FIG. 5 is a cross-sectional view illustrating hardmask removal, according to an exemplary embodiment of the present invention. Referring to FIG. 5, the hardmask portions 109' and portions of the liner layer 119 on sidewalls of the hardmask portions 109' are removed down to the patterned pad oxide layers 107' to form openings 125. The hardmask portions 109' and the portions of the liner layer 119, which according to an embodiment of the present invention each comprise a nitride, are selectively removed with respect to the dielectric layer 120 and the pad oxide portions 107', which according to an embodiment of the present invention each comprise an oxide. In accordance with an embodiment of the present invention, a wet phosphoric acid etch is used to remove the hardmask portions 109' and the portions of the liner layer 119.

Figure 6:
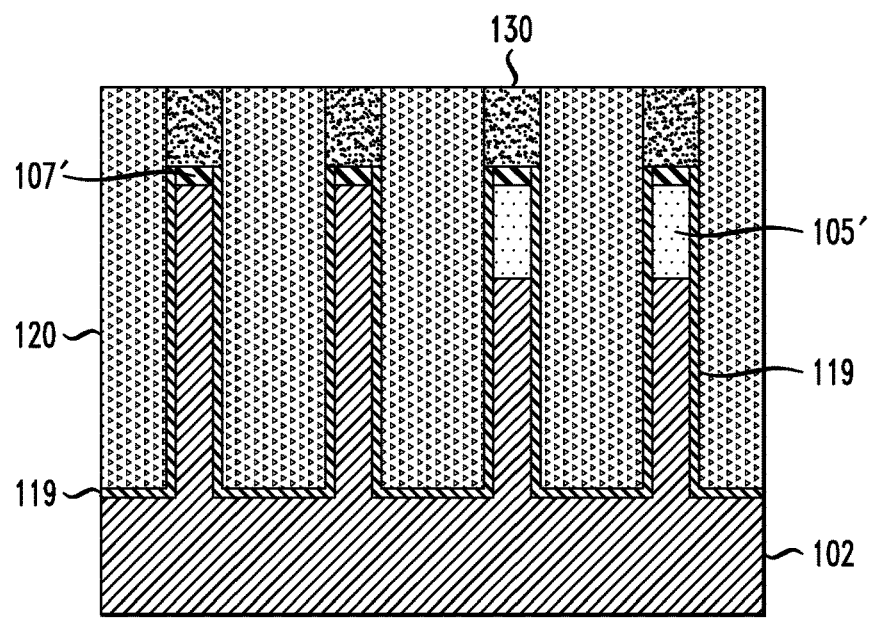
FIG. 6 is a cross-sectional view illustrating cap layer deposition, according to an exemplary embodiment of the present invention.

FIG. 6 is a cross-sectional view illustrating cap layer deposition, according to an exemplary embodiment of the present invention. Referring to FIG. 6, cap layers 130 (can also be referred to as hardmask layers) are deposited in the openings 125 on the pad oxide portions 107'. The cap layers 130 include, but are not necessarily limited to, amorphous silicon (a-Si) or polycrystalline silicon (p-Si). The cap layers 130 can be deposited using a deposition technique including, but not necessarily limited to, CVD, PECVD, RFCVD, PVD, ALD, MLD, MBD, PLD, LSMCD, and/or sputtering, followed by a planarization process, such as, CMP to remove excess cap layer material from on top of the dielectric layer 120.

Figure 7:
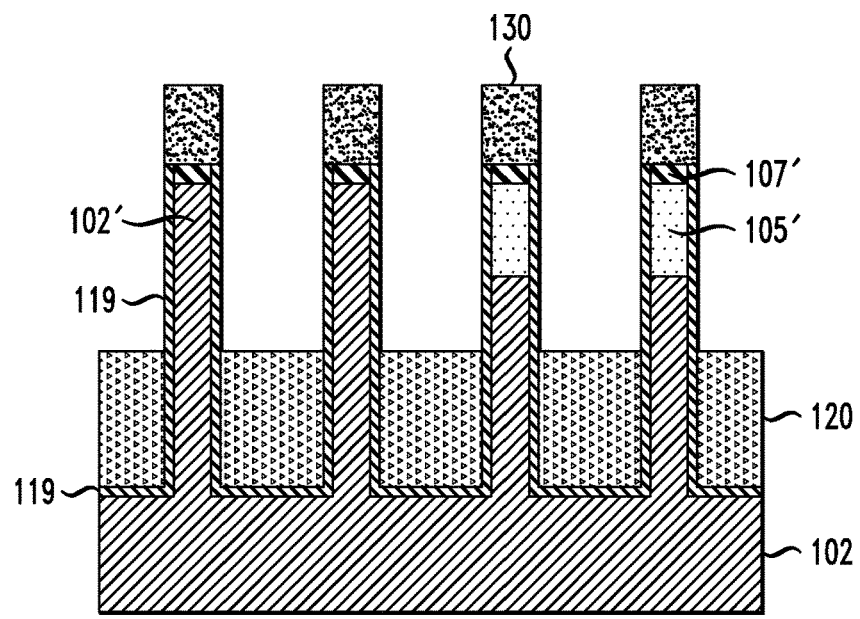
FIG. 7 is a cross-sectional view illustrating selective recessing of a dielectric layer, according to an exemplary embodiment of the present invention.

FIG. 7 is a cross-sectional view illustrating selective recessing of a dielectric layer, according to an exemplary embodiment of the present invention. Referring to FIG. 7, the dielectric layer 120 is recessed to a height below an active region of the fins 102' and 105' to form the isolation regions (e.g., shallow trench isolation (STI) regions) between the fins 102' and 105'. The isolation regions are on the recessed portions of the substrate 102. The removal of the dielectric layer 120 is selective with respect to material of the cap layers 130 (e.g., a-Si or p-Si), and with respect to the material of the liner layer 119 (e.g., nitride) and is performed by etching with, for example, a mixture of gases $CF_4$ (and/or $CHF_3$) and helium (and/or hydrogen). The material of the cap layers 130 has a higher etch selectivity with respect to the material of the dielectric layer 120 (e.g., oxide) than that of the material of hardmask portions 109' (e.g., nitride).

Figure 8:
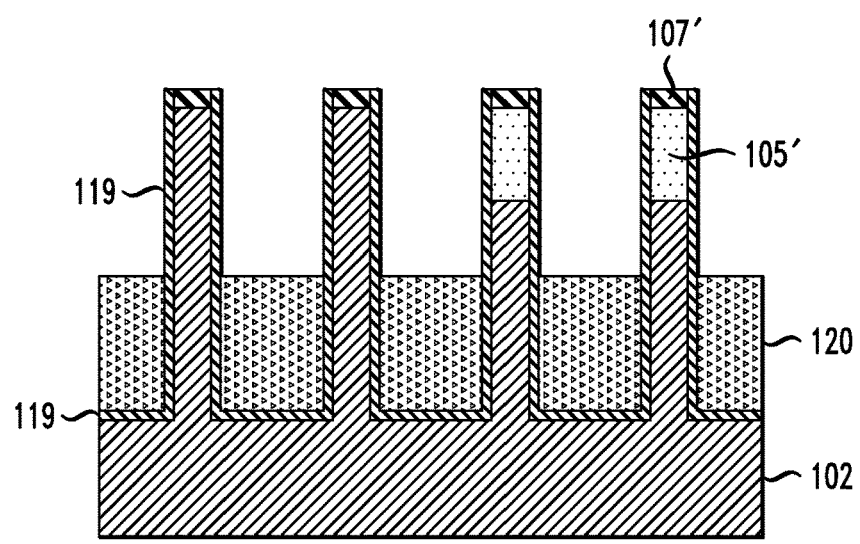
FIG. 8 is a cross-sectional view illustrating cap layer removal, according to an exemplary embodiment of the present invention.

FIG. 8 is a cross-sectional view illustrating cap layer removal, according to an exemplary embodiment of the present invention. Referring to FIG. 8, the cap layers 130 are removed from on top of the pad oxide portions 107' by, for example, etching with a wet etch process containing ammonia, or a dry etch process containing $SF_6$, which is selective with respect to the materials of the pad oxide portions 107' and the liner layer 119. The pad oxide portions 107' and the liner layer 119 protect the fins 102' and 105' during removal of the cap layers 130.

Figure 9:
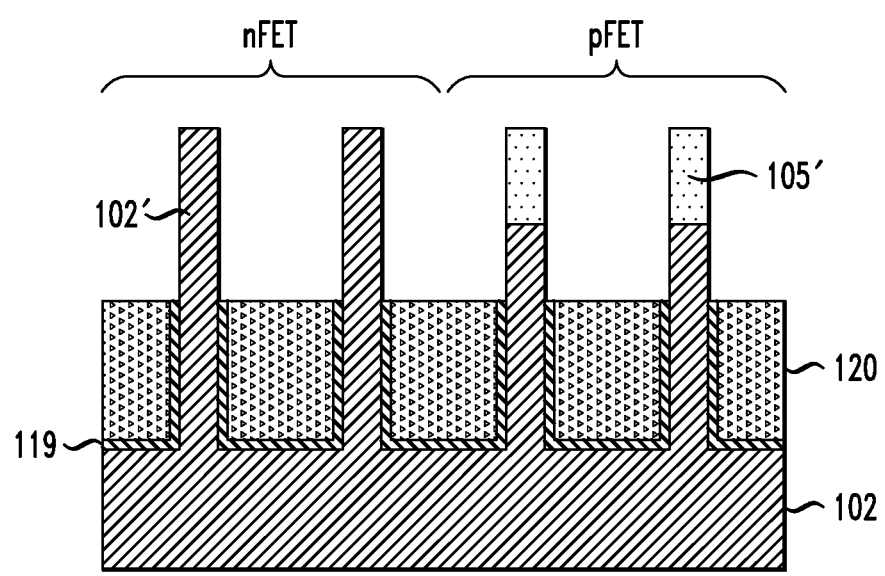
FIG. 9 is a cross-sectional view illustrating pad oxide and liner removal, according to an exemplary embodiment of the present invention.

FIG. 9 is a cross-sectional view illustrating pad oxide and liner removal, according to an exemplary embodiment of the present invention. Referring to FIG. 9, the exposed pad oxide portions 107' and the exposed portions of the liner layer 119 are removed from the fins 102' and 105'. The pad oxide portions 107' can be etched with, for example, a wet etch process containing hydrofluoric (HF) acid. The liner layer 119 (in the case of silicon nitride) can be etched with, for example, a wet etch process using phosphoric acid. The resulting structure in FIG. 9, including nFET region fins 102' and pFET region fins 105' and isolation regions between the fins 102' and 105' including the dielectric and liner layers 120 and 119, can be used in connection with further processing to form semiconductor devices such as, but not necessarily limited to, FinFET transistors including gate and source/drain regions formed on and/or around the fins.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a semiconductor device, comprising:
    patterning a plurality of fins on a semiconductor substrate, wherein a hardmask is formed on each of the plurality of fins;
    forming a dielectric layer on the semiconductor substrate between the plurality of fins;
    removing the hardmasks from each of the plurality of fins;
    forming a plurality of cap layers in place of the removed hardmasks on each of the plurality of fins, wherein the plurality of cap layers comprise at least one of amorphous silicon and polycrystalline silicon; and
    selectively recessing the dielectric layer with respect to the plurality of cap layers.

2. The method according to claim 1, wherein the hardmasks formed on each of the plurality of fins comprise a nitride.

3. The method according to claim 2, wherein the dielectric layer comprises an oxide.

4. The method according to claim 2, further comprising forming an oxide layer on each of the plurality of fins.

5. The method according to claim 4, wherein the oxide layers are positioned between the plurality of fins and the hardmasks.

6. The method according to claim 5, wherein the removing of the hardmasks from each of the plurality of fins exposes a top surface of each of the oxide layers.

7. The method according to claim 4, wherein the plurality of cap layers are formed on the oxide layers on each of the plurality of fins.

8. The method according to claim 7, further comprising removing the plurality of cap layers from each of the plurality of fins after selectively recessing the dielectric layer, wherein the removing of the plurality of cap layers exposes a top surface of each of the oxide layers.

9. The method according to claim 8, further comprising removing the oxide layers from each of the plurality of fins.

10. The method according to claim 1, further comprising forming a liner layer on the semiconductor substrate and on sidewalls of each of the plurality of fins, wherein the dielectric layer is formed on the liner layer.

11. The method according to claim 1, wherein a first fin of the plurality of fins in a first region comprises silicon, and a second fin of the plurality of fins in a second region comprises silicon germanium.

12. A method for manufacturing a semiconductor device, comprising:
    forming a plurality of channel regions spaced apart from each other and extending vertically from a semiconductor substrate, wherein a hardmask is formed on each of the plurality of channel regions;
    forming a dielectric layer on the semiconductor substrate between the plurality of channel regions;
    removing the hardmasks from each of the plurality of channel regions;
    forming a plurality of cap layers in place of the removed hardmasks on each of the plurality of channel regions, wherein the plurality of cap layers comprise at least one of amorphous silicon and polycrystalline silicon; and
    selectively recessing the dielectric layer with respect to the plurality of cap layers.

13. The method according to claim 12, wherein the hardmasks formed on each of the plurality of channel regions comprise a first material.

14. The method according to claim 13, further comprising forming a pad layer on each of the plurality of channel regions, wherein the pad layers comprise a second material different from the first material.

15. The method according to claim 14, wherein the pad layers are positioned between the plurality of channel regions and the hardmasks.

16. The method according to claim 15, wherein the removing of the hardmasks from each of the plurality of channel regions exposes a top surface of each of the pad layers.

17. The method according to claim 14, wherein the plurality of cap layers are formed on the pad layers on each of the plurality of channel regions.

18. The method according to claim 17, further comprising removing the plurality of cap layers from each of the plurality of channel regions after selectively recessing the dielectric layer, wherein the removing of the plurality of cap layers exposes a top surface of each of the pad layers.

19. The method according to claim 18, further comprising removing the pad layers from each of the plurality of channel regions.

20. A method for manufacturing a transistor device, comprising:

patterning a semiconductor substrate into a plurality of fins on the semiconductor substrate, wherein a hardmask portion and a dielectric layer are formed in a stacked configuration on each fin of the plurality of fins;

forming an isolation layer on the semiconductor substrate between the plurality of fins;

removing the hardmask portions from each of the plurality of fins, wherein the removing of the hardmasks from each of the plurality of fins exposes a top surface of each of the dielectric layers;

forming a plurality of cap layers in place of the removed hardmasks on each of the exposed top surfaces of each of the dielectric layers, wherein the plurality of cap layers comprise at least one of amorphous silicon and polycrystalline silicon; and selectively recessing the isolation layer with respect to the plurality of cap layers.

* * * * *